(12) United States Patent
Cao et al.

(10) Patent No.: US 11,996,415 B2
(45) Date of Patent: May 28, 2024

(54) DISPLAY PANEL AND METHOD OF MANUFACTURING THEREOF

(71) Applicant: Wuhan China Star Optoelectronics Technology Co., Ltd., Hubei (CN)

(72) Inventors: Zhihao Cao, Hubei (CN); Wei Tang, Hubei (CN); Jianlong Huang, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 972 days.

(21) Appl. No.: 16/966,015

(22) PCT Filed: Jul. 21, 2020

(86) PCT No.: PCT/CN2020/103217
§ 371 (c)(1),
(2) Date: Jul. 30, 2020

(87) PCT Pub. No.: WO2021/258468
PCT Pub. Date: Dec. 30, 2021

(65) Prior Publication Data
US 2023/0246035 A1 Aug. 3, 2023

(30) Foreign Application Priority Data
Jun. 22, 2020 (CN) .......................... 202010571923.8

(51) Int. Cl.
*H01L 27/12* (2006.01)
*G02F 1/1362* (2006.01)
*G02F 1/1368* (2006.01)

(52) U.S. Cl.
CPC ........ *H01L 27/124* (2013.01); *H01L 27/1259* (2013.01); *G02F 1/136222* (2021.01); *G02F 1/136295* (2021.01); *G02F 1/1368* (2013.01)

(58) Field of Classification Search
CPC ...................................................... H01L 27/124
USPC .......................................................... 257/59
See application file for complete search history.

(56) References Cited

U.S. PATENT DOCUMENTS

| | | | | |
|---|---|---|---|---|
| 2005/0130353 | A1* | 6/2005 | Yoo | H01L 27/1288 257/E21.414 |
| 2009/0251628 | A1* | 10/2009 | Lin | H01L 27/124 349/39 |
| 2010/0065852 | A1 | 3/2010 | Lin et al. | |
| 2011/0090438 | A1* | 4/2011 | Lee | G02F 1/136227 349/110 |

(Continued)

FOREIGN PATENT DOCUMENTS

| | | |
|---|---|---|
| CN | 1218286 | 6/1999 |
| CN | 1622300 | 6/2005 |

(Continued)

*Primary Examiner* — Dzung Tran

(57) ABSTRACT

A display panel and a method of manufacturing the display panel are provided. The display panel includes a substrate and a transistor layer. The transistor array layer includes a first metal layer disposed above the substrate. The first metal layer includes a gate, a second metal layer disposed above the first metal layer. The second metal layer includes a source, a drain, and a metal trace, and at least one repair part disposed on both sides of the metal trace. The repair part and the metal trace are configured to form a signal trace.

2 Claims, 2 Drawing Sheets

(56) References Cited

U.S. PATENT DOCUMENTS

| | | | |
|---|---|---|---|
| 2012/0007083 A1* | 1/2012 | You | H10K 59/121 |
| | | | 257/E33.012 |
| 2012/0080663 A1* | 4/2012 | Lee | H10K 59/1213 |
| | | | 438/23 |
| 2012/0142128 A1 | 6/2012 | Kwon | |
| 2016/0116641 A1 | 4/2016 | Minami et al. | |
| 2017/0309651 A1* | 10/2017 | Kim | H01L 27/1225 |

FOREIGN PATENT DOCUMENTS

| | | |
|---|---|---|
| CN | 101676781 | 3/2010 |
| CN | 102645807 | 8/2012 |
| CN | 103730413 | 4/2014 |
| CN | 105549775 | 5/2016 |
| CN | 109887983 | 6/2019 |
| JP | 2006-049425 | 2/2006 |
| KR | 2001-0003683 | 1/2001 |

\* cited by examiner

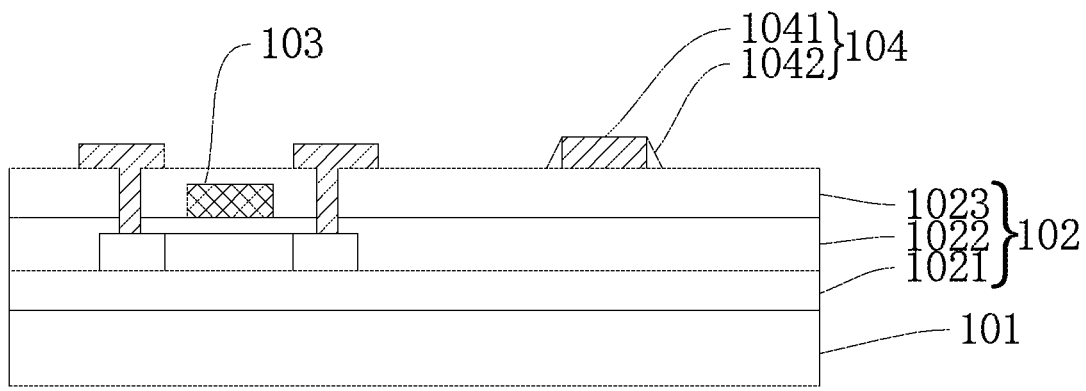

FIG. 3

| forming a first metal layer and a second metal layer disposed above the first metal layer on a substrate, wherein the first metal layer comprises a gate, and the second metal layer comprises a source, a drain, and a metal trace | S10 |

| forming at least one repair part on both sides of the metal trace, wherein the repair part and the metal trace are configured to form a signal trace | S20 |

FIG. 4

DISPLAY PANEL AND METHOD OF MANUFACTURING THEREOF

RELATED APPLICATIONS

This application is a National Phase of PCT Patent Application No. PCT/CN2020/103217 having International filing date of Jul. 21, 2020, which claims the benefit of priority of Chinese Patent Application No. 202010571923.8 filed on Jun. 22, 2020. The contents of the above applications are all incorporated by reference as if fully set forth herein in their entirety.

BACKGROUND OF INVENTION

Field and Background of the Invention

The present invention relates to the field of display technology, and more particularly, to a display panel and a method of manufacturing thereof.

Low temperature poly-silicon (LTPS) thin film transistor liquid crystal display devices are different from traditional amorphous silicon thin film transistor liquid crystal display devices, where their electron mobility may reach more than 200 $cm^2$/V-sec, which may effectively reduce thin film transistor devices to increase an aperture ratio, and may reduce the overall power consumption while increasing the brightness of display devices. In addition, the higher electron mobility can integrate a part of the driving circuit on the glass substrate, which reduces the number of driving integrated circuits (IC), and it may also greatly improve reliability of the liquid crystal display panels, thereby greatly reducing manufacturing cost of the panels. Therefore, there has been a gradual focus on LTPS thin film transistor liquid crystal display devices.

In fabricating LTPS display devices, in order to reduce signal transmission impedance, a Ti—Al—Ti sandwich structure is generally used in a second metal layer corresponding to a source and drain to form metal traces. But aluminum (Al) in the intermediate layer is prone to side etching so as to form a gap, which causes defects in the reflection of light by the metal traces, which in turn makes uneven display brightness of the display devices.

SUMMARY OF THE INVENTION

The embodiments of the present invention provide a display panel and a method of manufacturing thereof, which solve the problem in the prior art that the side etching of a part of layer in the second metal layer affects the reflection path of the second metal layer to light, thereby making uneven display brightness of the display devices.

A display panel comprises:
an array substrate; and
a color filter substrate disposed opposite to the array substrate. The array substrate comprises a substrate and a transistor array layer disposed on the substrate. The transistor array layer comprises:
a first metal layer disposed above the substrate, and the first metal layer comprises a gate;
a second metal layer disposed above the first metal layer, and the second metal layer comprises a source, a drain, and a metal trace; and
at least one repair part disposed on both sides of the metal trace, wherein the repair part and the metal trace are configured to form a signal trace.

In one embodiment, a cross-sectional shape of the signal trace comprises a trapezoid.

In one embodiment, both sides of the signal traces are flat surfaces.

In one embodiment, the cross-sectional shape of the signal trace is an isosceles trapezoid, and a bottom angle of the isosceles trapezoid is between 20° and 80°.

In one embodiment, a material of the repair part comprises tungsten.

In one embodiment, the metal trace comprises a first metal conductive layer, a second metal conductive layer, and a third metal conductive layer that are stacked; and a side of the second metal conductive layer opposite to sides of the first metal conductive layer and the second metal conductive layer shrinks inward to form a gap, and the repair part is filled into the gap.

A method of manufacturing a display panel comprises:
step S10, forming a first metal layer and a second metal layer disposed above the first metal layer on a substrate, and the first metal layer comprises a gate, and the second metal layer comprises a source, a drain, and a metal trace; and
step S20, forming at least one repair part on both sides of the metal trace, and the repair part and the metal trace are configured to form a signal trace.

In one embodiment, in the step S10, etching the second metal layer to form the source, the drain, and the metal trace; and forming a gap on a side of the metal trace.

In one embodiment, in the step 20, forming the repair part by using a laser-assisted vapor deposition, and the at least one repair part is filled into the gap.

In one embodiment, a material of the repair part comprises tungsten.

In one embodiment, a cross-sectional shape of the signal trace comprises a trapezoid.

In one embodiment, both sides of the signal traces are flat surfaces.

In one embodiment, the cross-sectional shape of the signal trace is an isosceles trapezoid, and a bottom angle of the isosceles trapezoid is between 20° and 80°.

Accordingly, a display panel and a method of manufacturing thereof are provided. By forming repair parts on both sides of the metal trace of the second metal layer to repair the topographic defects formed by etching sides of the metal traces, so that the formed signal traces reflect light along the preset path. That is, the light reflected by the signal traces may be blocked by the black matrix, which prevents the reflected light from entering other areas, improves brightness uniformity of the display panel, the product yield, and product quality.

BRIEF DESCRIPTION OF THE SEVERAL VIEWS OF THE DRAWINGS

The following detailed description of specific implementations of the present invention in conjunction with the accompanying drawings will make the technical solutions and other beneficial effects of the present invention obvious.

FIG. 3 is a schematic view of the structure of an array substrate provided by one embodiment of the present invention.

FIG. 4 is a flowchart of a method of manufacturing a display panel provided by one embodiment of the present invention.

DESCRIPTION OF SPECIFIC EMBODIMENTS OF THE INVENTION

Figure 1:
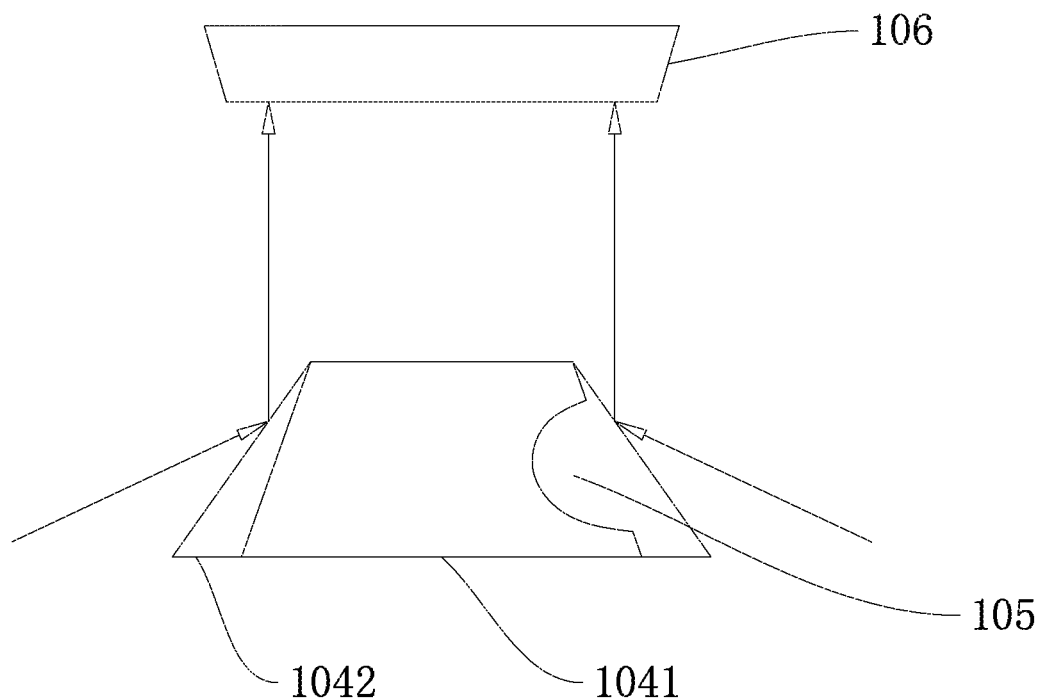
FIG. 1 is a schematic view of a signal trace structure provided by one embodiment of the application.

The preferred embodiments of the present invention are described in detail below with reference to the accompanying drawings. Those skilled persons in the art will easily understand how to implement the invention. The invention can be implemented by the embodiments, so that the technical content of the disclosure will be clear, so that those skilled persons in the art will understand how to implement the invention. The present invention may be accomplished in many different embodiments, and the scope of the invention is not limited to the embodiments described herein.

In the description of the present invention, it is to be understood that the terms "center," "longitudinal," "lateral," "length," "width," "thickness," "upper," "lower," "front," "back," "left," "right," "vertical," "horizontal," "top," "bottom," "inside," "outside," "clockwise," "counterclockwise," etc., indicated as orientation or positional relationship are based on the orientation or positional relationship shown in the drawings, they merely intend to illustrate the present invention and simplify the description, but are not to be as indicating or implying specific devices or elements having specific orientation, specific orientation structure and operating. Therefore, it cannot be understood as limitations. Moreover, the terms "first" and "second" are merely used for describing purposes, but are not to be conceived as indicating or implying a relative important or implicitly indicating specific technical feature numbers. Accordingly, the feature limitations of "first" or "second" may include one or more of the described features explicitly or implicitly. In the description of the present invention, the meaning of "a plurality of" is two or more, unless otherwise explicitly defined.

In the description of the present invention, it should be noted that, unless otherwise explicitly defined, the terms "installation," "adjacent" and "connection" are to be understood broadly, for example, it may be fixed connection, disassembly connection or integral connection; it may be mechanical connection, electrically connection or interconnection; it may be directly connection or indirectly connected through an intermediate medium; and it may be interconnection of two elements or interaction of two elements. A person skilled in the art can conceive the specific meanings of the above-mentioned terms in the present invention based on the specific situation.

In the present invention, unless otherwise specifically defined and defined, the first feature is disposed "on" or "under" the second feature, which means that the first feature directly contacts the second feature, and also the first feature is not in direct contact the second feature but through addition features between them. Moreover, the first feature is disposed "above," "on" and "upper" the second feature, which means that the first feature is directly or substantially above the second feature, or merely indicates that the first feature level is higher than the second feature. The first feature is "below," "under" and "underneath" the second feature, which means that the first feature is directly or substantially below the second feature, or merely indicates that the first feature level is less than the second feature.

The following disclosure provides many different embodiments or examples for implementing different structures of the present invention. In order to simplify the disclosure of the present invention, the components and arrangements of the specific examples are described below. Of course, they are merely examples and are not intended to limit the invention. In addition, the present invention may be repeated with reference numerals in the various examples, which are for the purpose of simplicity and clarity, and do not indicate the relationship between the various embodiments and/or arrangements discussed. Moreover, the present invention provides embodiments of various specific processes and materials, but a person skilled in the art may recognize the use of other processes and/or the use of other materials.

In the prior art, a part of layer in a second metal layer of a display panel is etched laterally, so a reflection path of the second metal layer to the light is affected, thereby causing the technical problem of uneven display brightness of the display panel.

In order to solve the above-mentioned problem, a display panel is provided. Referring to FIG. 1 and FIG. 3, the display panel comprises an array substrate and a color filter substrate disposed opposite to the array substrate. The array substrate comprises a substrate 101 and a transistor array layer 102 disposed on the substrate 101. The transistor array layer 102 comprises a first metal layer disposed above the substrate 101, and the first metal layer comprises a gate 103; a second metal layer disposed above the first metal layer, and the second metal layer comprises a source, a drain, and a metal trace 1041; and at least one repair part 1042 disposed on both sides of the metal trace 1041, and the repair part 1042 and the metal trace 1041 are configured to form a signal trace 104.

Figure 2:
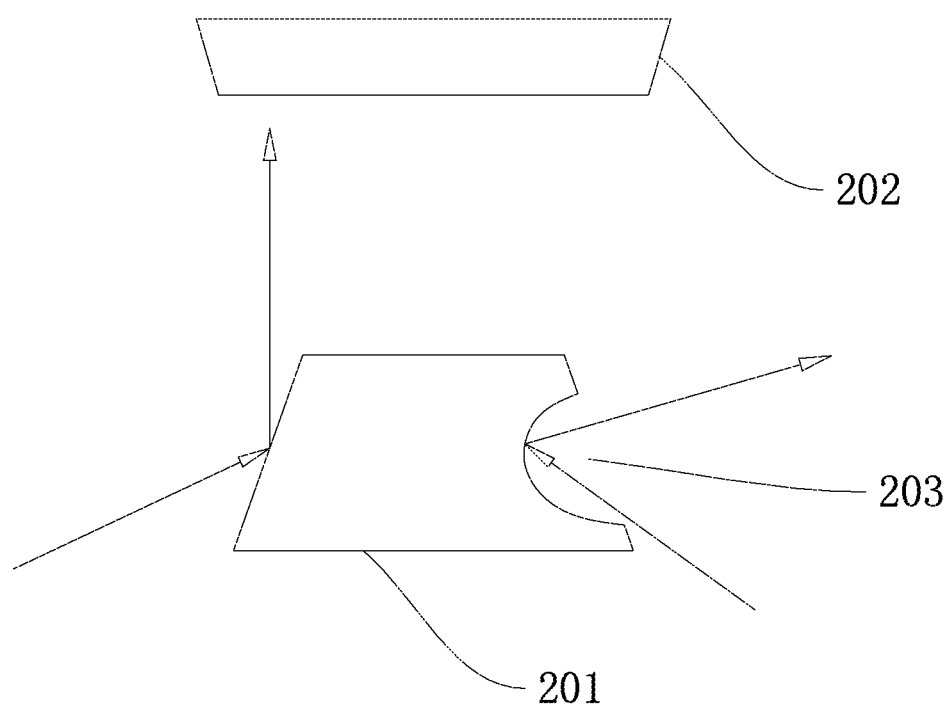
FIG. 2 is a schematic view of the structure of a conventional signal trace.

In implementation of the process, please refer to FIG. 2, in the display panel of the prior art, the second metal layer is etched to form a metal trace 201 in the fabrication process, and a general structure of the metal traces 201 is a Ti—Al—Ti sandwich structure, and aluminum (Al) in the middle layer is prone to side etching, and then a gap 203 is formed on a side of the metal trace 201. When light irradiates the side of the metal trace 201, the reflection path of the metal trace 201 is in disorder due to the gap 203, so that the reflected light may not be blocked by black matrix 202 on the color film substrate, which causes uneven display brightness of the display panel. In the embodiment of the present invention, at least one repair part is disposed on both sides of the metal traces to repair defect caused by the gap, so that the light may be reflected along the preset path, and thus it is blocked by the black matrix. Therefore, it improves brightness uniformity of the display panel, product yield, and product quality.

Specifically, referring to FIG. 1 and FIG. 3, the display panel comprises an array substrate and a color filter substrate disposed opposite to the array substrate. It is not shown in the figures, and the embodiment of the present invention only shows relevant structures, and the other structure may be set with reference to conventional technology. The array substrate comprises a substrate 101 and a transistor array layer 102 disposed on the substrate 101.

Furthermore, the transistor array layer 102 comprises a buffer layer 1021 disposed on the substrate 101, an active layer disposed on the buffer layer 1021, a first insulating layer 1022 disposed on the buffer layer 1021 and covering the active layer, a first metal layer disposed on the first insulating layer 1022, a second insulating layer 1023 disposed on the first metal layer and covering the first metal layer, and a second metal layer disposed on the second insulating layer 1023.

In the embodiment, the first metal layer comprises a gate 103. The second metal layer comprises a source, a drain, and a metal trace 1041.

The transistor array layer 102 further comprises a repair part 1042. At least one repair part 1042 is disposed on both sides of the metal trace 1041, and the repair part 1042 and the metal trace 1041 are configured to form a signal trace 104. A material of the repair part 1042 comprises tungsten.

In the embodiment, sides of the metal trace 1041 shrink inward to form a gap 105, and at least one repair part 1042 is filled into the gap 105 to repair the topographic defect on the metal trace 1041. It should be noted that the metal trace 1041 comprises a first metal conductive layer, a second metal conductive layer, and a third metal conductive layer that are stacked. A side of the second metal conductive layer opposite to sides of the first metal conductive layer and the second metal conductive layer shrinks inward to form a gap 105, and the repair part 1042 is filled into the gap 105. Moreover, the first metal conductive layer and the third metal conductive layer may be made of titanium, and the second metal layer may be aluminum, but the structure and material of the metal trace 1041 are not limited thereto. Any topographic defect on the metal trace 1041 may be repaired by the repair part 1042, that is, the repair part 1042 may be disposed on the side and/or top of the metal trace 1041, so that the formed signal trace 104 has a good light reflection effect.

A cross-sectional shape of the signal trace 104 comprises a trapezoid. In one embodiment, he cross-sectional shape of the signal trace is an isosceles trapezoid, and a bottom angle of the isosceles trapezoid is between 20° and 80°. Furthermore, the bottom angle of the isosceles trapezoid is 60°.

In the embodiment, both sides of the signal trace 104 are flat surfaces, so that the light reflected by the signal trace 104 may follow a preset path, that is, reflect in a direction way indicated by the arrow in FIG. 1.

It should be noted that the display panel comprises a color filter substrate, and a black matrix 106 is disposed on a side of the color filter substrate facing the array substrate, and the signal trace 104 is provided with the repair part 1042, so that the light reflected by the signal trace 104 may be blocked by the black matrix 106 and may not be reflected to other areas, thereby preventing uneven display brightness of the display panel.

In addition, one embodiment of the present invention also provides a method of manufacturing the display panel described in the above-mentioned embodiments. Referring to FIG. 1, FIG. 3, and FIG. 4. The method comprises following steps:

In the step S10, forming a first metal layer and a second metal layer disposed above the first metal layer on a substrate, and the first metal layer comprises a gate 103, and the second metal layer comprises a source, a drain, and a metal trace 1041.

Specifically, forming a buffer layer 1021 on the substrate 101 in order, forming an active layer on the buffer layer 1021, forming the first insulating layer 1022 on the buffer layer 1021, which covers the active layer, forming a first metal layer on the first insulating layer 1022, and patterning the first metal layer to form the gate 103, and forming a second insulating layer 1023 on the first insulating layer 1022, which covers the gate 103, forming a second metal layer on the second insulating layer 1023, and patterning the second metal layer is patterned, that is, an etching process, so as to form a source, a drain, and a metal trace 1041.

Moreover, in the etching process, the metal trace 1041 is prone to lateral etching, so that a gap 105 is formed on the side of the metal trace 1041.

In the step S20, forming at least one repair part 1042 on both sides of the metal trace 1041. The repair part 1042 and the metal trace 1041 are configured to form a signal trace 104.

After etching the second metal layer, the repair part is formed by using a laser-assisted vapor deposition, and the repair part 1042 is formed on both sides of the metal trace 1041, and the at least one repair part 1042 is filled into the gap 105. The repair part 1042 and the metal trace 1041 are configured to form a signal trace 104, so both sides of the signal traces are flat surfaces.

In one embodiment, a material of the repair part 1042 comprises tungsten.

In addition, the display panel manufactured by the method of the embodiment is the same as the display panel described in the above-mentioned embodiments, and will not be repeated here, and the fabrication of the array substrate may be completed by referring to the conventional manufacturing process. The fabrication of the color filter substrate to form the display panel, and the embodiment of the is directed to the second metal layer. Therefore, the rest of the manufacturing process is not described in detail here, and the embodiment is directed to the repair of the signal trace. The method may also be used for source, drain, or other metal traces, which is not limited herein.

Accordingly, a display panel and a method of manufacturing thereof are provided. By forming repair parts on both sides of the metal trace of the second metal layer to repair the topographic defects formed by etching sides of the metal traces, so that the formed signal traces reflect light along the preset path. That is, the light reflected by the signal traces may be blocked by the black matrix, which prevents the reflected light from entering other areas, improves brightness uniformity of the display panel, the product yield, and product quality.

In the above-mentioned embodiments, the description of each embodiment has its own emphasis. For parts that are not described in detail in an embodiment, reference may be made to related descriptions of other embodiments.

In the above, the display panel and the method of manufacturing thereof provided by the embodiments of the present application are described in detail, and the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A display panel, comprising:
  an array substrate;
  wherein the array substrate comprises a substrate and a transistor array layer disposed on the substrate;
  wherein the transistor array layer comprises:
  a first metal layer disposed above the substrate, wherein the first metal layer comprises a gate;
  a second metal layer disposed above the first metal layer, wherein the second metal layer comprises a source, a drain, and a metal trace; and
  at least one repair part disposed on both sides of the metal trace,
  wherein the metal trace comprises a first metal conductive layer, a second metal conductive layer, and a third metal conductive layer that are stacked, a side of the second metal conductive layer is recessed relative to a side of the first metal conductive layer and a side of the third metal conductive layer to form a gap, and the repair part at least fills the gap, the repair part and the metal trace are configured to form a signal trace, a cross-sectional shape of the signal trace comprises a trapezoid, both sides of the signal traces are flat surfaces, and a material of the repair part comprises tungsten.

2. The display panel according to claim 1, wherein the cross-sectional shape of the signal trace is an isosceles trapezoid, and a bottom angle of the isosceles trapezoid is between 20° and 80°.

* * * * *